(12) United States Patent
Kotra et al.

(10) Patent No.: US 7,221,200 B1
(45) Date of Patent: May 22, 2007

(54) PROGRAMMABLE LOW VOLTAGE RESET APPARATUS FOR MULTI-VDD CHIPS

(75) Inventors: Prasad Kotra, Bangalore (IN); Sunil Thamaran, Bangalore (IN); Shailesh Shah, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 52 days.

(21) Appl. No.: 11/075,632

(22) Filed: Mar. 8, 2005

Related U.S. Application Data

(60) Provisional application No. 60/556,179, filed on Mar. 24, 2004.

(51) Int. Cl.
  *H03L 7/00* (2006.01)
(52) U.S. Cl. ...................... 327/143; 327/142

(58) Field of Classification Search ......... 327/142–143
See application file for complete search history.

(56) References Cited

U.S. PATENT DOCUMENTS

| | | | |
|---|---|---|---|
| 5,894,423 A * | 4/1999 | Ling et al. ................. 700/293 |
| 6,188,257 B1 * | 2/2001 | Buer ......................... 327/143 |
| 6,265,848 B1 * | 7/2001 | Mukainakano ............. 320/132 |
| 6,806,747 B2 * | 10/2004 | Honda et al. ............... 327/108 |

* cited by examiner

*Primary Examiner*—Dinh T. Le
(74) *Attorney, Agent, or Firm*—Marger Johnson & McCollom P.C.

(57) ABSTRACT

A programmable low voltage reset apparatus for a device having a plurality of power supplies comprises a low voltage signal generator for sensing when a power supply output decreases below a predetermined voltage and generating a reset signal, a reset selector for selecting one of the power supplies, and a programmable reference voltage for varying a reference voltage according to the voltage of the selected power supply.

19 Claims, 2 Drawing Sheets

US 7,221,200 B1

PROGRAMMABLE LOW VOLTAGE RESET APPARATUS FOR MULTI-VDD CHIPS

RELATED APPLICATION DATA

This application claims priority from U.S. Provisional Application No. 60/556,179 filed Mar. 24, 2004.

BACKGROUND OF THE INVENTION

1. Field of the Invention

The invention relates generally to electronic circuits and, more particularly, to circuits for performing a reset scheme in devices having multiple power supplies.

2. Description of the Related Art

Low voltage reset schemes are used in devices required to perform operations from the time a low voltage indication is generated to the time power is lost for all operational purposes. These operations may include protecting values in some important status registers by storing them to a non-volatile storage on board or device, protecting a data being written to a non-volatile memory, and other related functions. These low voltage reset schemes are generally used in microcontroller-based circuits. In one conventional embodiment, certain 5V microcontroller devices have used these kinds of circuit to protect on-chip flash memory when power falls below 4.1V.

FIG. 1 is a block diagram of a conventional low voltage inhibits reset signal generation circuit 1. As shown, the conventional low voltage reset scheme is based on comparing a resistor divided value of the power supply (Vdd) with a stable reference like a bandgap voltage (Vbg). The low voltage reset signal LVI_reset is coupled to a reset logic for issuing a "reset" signal to a pin depending on the voltage level of the supply voltage (Vdd).

The conventional solution in FIG. 1 comprises a voltage reference generated by a resistor divider network 2, where at the top of the network is a power supply (Vdd) and the output of the resistor network comprises a voltage reference signal 3. The voltage reference signal 3 is coupled to the negative input of a comparator 5. The positive input of the comparator 5 is coupled to a bandgap reference voltage Vbg, and the output of the comparator 5 forms a low voltage indicator reset signal LVI_reset.

A disadvantage of the conventional solution is that the low voltage inhibit reset signal generation circuit 1 cannot support devices having multiple power supply levels (multiple Vdds). When there are multiple Vdds on a chip, a reset circuit needs to be activated when one or more of the Vdds is lost. It is also desirable to have a user select whether to activate reset on the device when one specific Vdd is lost or when any one of the Vdds is lost.

It would be desirable to have a device capable of supporting multiple power supply levels because the device may need to interface with other devices operating under different power supply levels on a board.

SUMMARY OF THE INVENTION

In one embodiment, the low voltage reset apparatus for a device having a plurality of power supplies comprises a low voltage signal generator for sensing when a power supply output decreases below a predetermined voltage and generating a reset signal, a reset selector coupled to the low voltage signal generator for selecting one of the power supplies, and a programmable reference voltage generator for varying a reference voltage according to the voltage of the selected power supply.

In one embodiment of the low voltage reset apparatus, the reset selector comprises a first state and a second state.

In one embodiment, the reset selector is set to the first state during a power up operation, and the low voltage signal generator is disabled at the first state.

In one embodiment of the low voltage reset apparatus, the reset selector is set to the second state after the power up operation, and the low voltage signal generator is enabled at the second state.

In one embodiment, the reset selector is controlled by firmware. In one embodiment, the reset selector comprises a latch element coupled to a multiplexer.

In one embodiment of the low voltage reset apparatus, the reference voltage generator is controlled by firmware. In one embodiment, the programmable reference voltage generator comprises a resistor ladder.

In one embodiment of the low voltage reset apparatus, the low voltage signal generator is disabled during a power up operation if the selected power supply is at a first voltage and enabled after the power up operation if the selected power supply is at a second voltage higher than the first voltage.

BRIEF DESCRIPTION OF THE DRAWINGS

The above and other features and advantages of embodiments of the invention will become readily apparent by reference to the following detailed description when considered in conjunction with the accompanying drawings.

DETAILED DESCRIPTION OF THE EMBODIMENTS

The invention will be described below with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
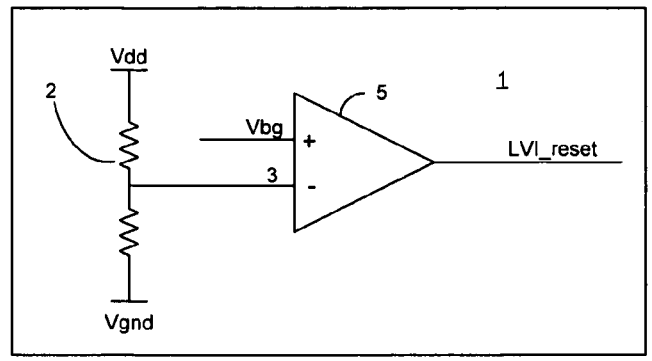
FIG. 1 is a block diagram of a conventional low voltage inhibit reset signal generation circuit.
Figure 2:
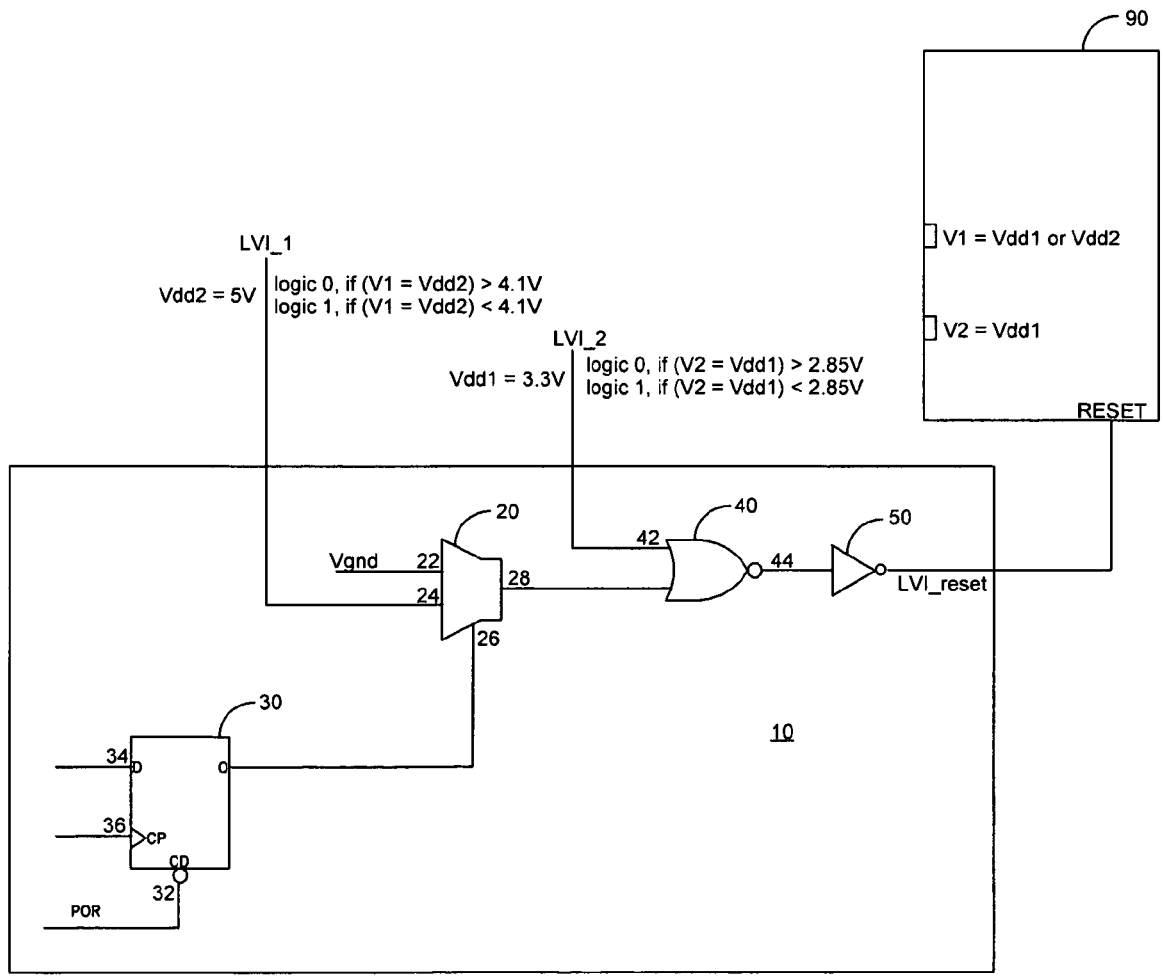
FIG. 2 is a programmable low voltage inhibit reset signal generation circuit for multiple power supply applications.

FIG. 2 shows a programmable low voltage inhibit reset signal generation circuit 10 for multiple power supply applications. In one embodiment of a programmable low voltage induced reset scheme, a device 90 such as for example, a 3.3V microcontroller, may operate with a plurality of power supply devices. On the 3.3V microcontroller device, there may be two power supplies V1 and V2, and the device performs a reset operation when any of the power supplies is lost.

The programmable low voltage inhibit reset signal generation circuit 10 comprises a multiplexer 20 having first 22 and second 24 inputs, a control input 26, and an output 28. This circuit is part of reset block inside device 90. The first input 22 of the multiplexer 20 is coupled to a power supply ground level Vgnd. The second input 24 of the multiplexer 20 is coupled to a first supply voltage low voltage inhibit signal LVI_1. The low voltage inhibit signal LVI_1 is low if the voltage at the first supply V1 is above a predetermined threshold, and high if the voltage at the first supply V1 is below the predetermined threshold. If a requirement arises to add a third power supply to a device, the first input 22 can be connected to a low voltage inhibit signal from a third power supply provided that the signal is generated similar to the low voltage inhibit signal LVI_1.

The programmable low voltage inhibit reset signal generation circuit 10 further comprises a flip-flop 30 having an output coupled to the control input 26 of the multiplexer 20. The flip-flop 30 has an enable input 32, which is coupled to a power on reset (POR) signal. The flip-flop 30 further comprises a data input 34 and a clock input 36.

The programmable low voltage inhibit reset signal generation circuit 10 further comprises a NOR gate 40. A first input 42 to the NOR gate 40 is coupled to a second supply voltage low voltage inhibit signal LVI_2. The second supply voltage low voltage inhibit signal LVI_2 is low if the voltage at the second supply V2 is above a predetermined threshold, and high if the voltage at the second supply V2 is below the predetermined threshold.

The output 44 of the NOR gate 40 comprises a low-voltage inhibit reset signal LVI_reset, which is a function of the first supply voltage low voltage inhibit signal LVI_1 and the second supply voltage low voltage inhibit signal LVI_2. The programmable low voltage inhibit reset signal generation circuit 10 may further comprise an inverter 50 after the NOR gate 40, depending on the requirements of a particular application.

In one embodiment, the first power supply V1 may be taken to multiple power supply levels (for example, Vdd1 at 3.3V or Vdd2 at 5V) based on user application and the second supply V2 is at Vdd1 (3.3V) only. Since the voltage level at the first power supply V1 depends on the user application, the voltage at which low voltage reset need to be activated may also be decided by the user. For example, if the first power supply V1 is at 5V, then a low voltage reset may be activated when that supply falls below 4.1V. If the first power supply V1 is at 3.3V, both power supplies V1 and V2 may be derived from the same source, and the low voltage activated reset may be performed by the circuit on the second supply V2.

In one exemplary embodiment, the voltage at the first supply V1 is at approximately 5V and the threshold for the first supply voltage low voltage inhibit signal LVI_1 is approximately 4.1V. In one exemplary embodiment, the voltage at the second supply V2 is at approximately 3.3V and the threshold for the second supply voltage low voltage inhibit signal LVI_2 is approximately 2.85 Volts.

In one embodiment, the first supply V1 may be 3.3V or 5V depending on user application. That is, the voltage at V1 is not determined until the user makes a selection well after power-up of the device 90. Hence, a low voltage reset signal LVI_1 from the first power supply V1 cannot be used to activate the reset cycle during power-up since the device will always remain in reset if its application is to power up only to 3.3V. When the voltage at the first supply V1 is at 3.3V, the first supply voltage low voltage inhibit signal LVI_1 will always remain high; hence, a user program will not use the first supply voltage low voltage inhibit signal LVI_1 for chip reset.

However, a first supply voltage induced reset is still required during a power loss. A user may write into a configuration register through firmware whether to activate a low voltage reset signal LVI_L during a power loss on the first power supply V1. In one embodiment as shown in FIG. 2, the configuration may be implemented as a D-type flip flop (DFF) 30. If the first and second power supplies V1 and V2 are both 3.3V, then the user does not write anything to the register to change its state, and reset may be activated through the second power supply V2 only. Typically, when both power supplies are at a common level, they are normally generated from one source on board.

If the user decides to use the first supply voltage low voltage inhibit signal LVI_1 information by writing into a configuration register, the first supply voltage low voltage inhibit (LVI) signal activated reset cycle will start once that supply falls below the first threshold voltage (4.1 V in one embodiment). This is applicable when the user application for the first power supply V1 is at voltage level Vdd2 (5V in one embodiment) and generated from a different and independent source on the board.

Thus, the programmable low voltage inhibit reset signal generation circuit 10 can be designed such that a user determines the conditions at which a low voltage induced reset signal is activated. Configuration registers which can be written through firmware after power-up can be provided and, thus, whether to use the reset through any of the power supplies upon power-up may be programmed. If a single power supply pin on a device can be taken to multiple supply levels based on the application, a configuration register may be associated with that power supply. The configuration register will be initialized to a logic state (upon power-on), which will disable the dependence of reset activated through that power supply upon power-up. This will ensure that the device will power up (not remain in reset) even if the power supply is assigned to the lowest possible value as per the user's application. If the power supply application on that pin is different, then user can write the configuration register and decide whether to use the low voltage reset from that supply during power loss.

Figure 3:
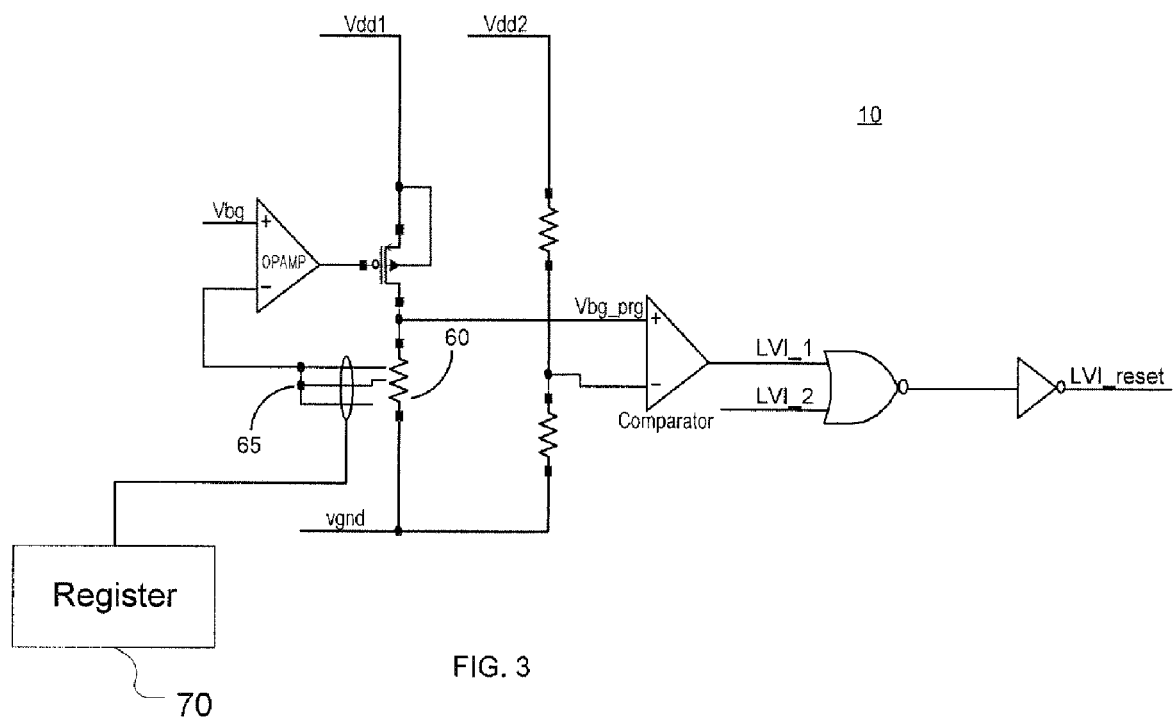
FIG. 3 is a low voltage inhibit reset signal generation circuit having a programmable reference voltage.

FIG. 3 shows an embodiment of a programmable low voltage inhibit reset signal generation circuit 10 having a programmable reference voltage Vbg_prg. Usually a fixed bandgap reference voltage Vbg (1.2V) is used as a reference. The fixed bandgap reference voltage Vbg can be amplified by a user by writing into a register 70 through firmware if the Vdd is higher. Tapping points 65 in resistor ladder 60 may be controlled by configuration bits in a register 70 programmed by a user. If a user programs the configuration bits in a register 70 to tap at a lower end of a resistor ladder 60, then programmable reference voltage Vbg_prg will be set to a higher voltage (for example, 1.8V), which is suitable for a Vdd2 of 5V. If a user programs the configuration bits to tap at a higher end of resistor ladder 60, then programmable reference voltage Vbg_prg will be set to a lower voltage (for example, 1.2V), which is suitable for a Vdd2 of 3.3V.

In one embodiment, the programmable reference voltage Vbg_prg may be set to be suitable for a Vdd2 of 3.3V and the threshold for the first supply voltage low voltage inhibit signal LVI_1 is approximately 2.85V. That is, the first supply voltage low voltage inhibit signal LVI_1 is low if Vdd2 is above 2.85V and high if Vdd2 is below 2.85V. In another embodiment, the programmable reference voltage Vbg_prg may be set to be suitable for a Vdd2 of 5V and the threshold for the first supply voltage low voltage inhibit signal LVI_1 is approximately 4.1V.

In one embodiment, the programmable reference voltage Vbg_prg may be set to be suitable for a Vdd2 of 3.3V and the threshold for the second supply voltage low voltage inhibit signal LVI_2 is approximately 2.85V.

A programmable low voltage inhibit reset scheme for multiple power supply operation has an advantage that includes protecting external devices (flash) from getting corrupted when any one of the power supplies is lost. In the event that power is lost when a device is performing a flash (external or internal) write operation or if the voltage level falls below the operating voltage of flash before the write operation is complete, then the write operation will not be successful and existing data in flash may get corrupted. This may result in loss of data stored in the non-volatile memory. It is important to detect power supply droop below a pre-determined threshold and complete the current flash write operation before the supply droops below the minimum operational voltage for flash.

A further advantage includes that the programmable low voltage inhibit reset scheme may avoid network jams in the event of power failure on any of the nodes (devices) connected in the network. In the case of a network operation, when the power supply of the device droops below a certain threshold, we need to activate a reset, communicate it to interfacing devices and stop driving the network so that the other nodes or devices on the same network will not be affected and communication will not be disturbed.

Moreover, the programmable low voltage inhibit reset scheme of the disclosed invention does not need any external low voltage detect circuits even though the devices operate in a multiple power supply environment.

It should be appreciated that reference throughout this specification to "one embodiment" or "an embodiment" means that a particular feature, structure or characteristic described in connection with the embodiment is included in at least one embodiment of the invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

We claim:

1. A low voltage reset apparatus, comprising:
   a programmable reference voltage generator for generating a programmable reference voltage according to a power supply voltage;
   a low voltage signal generator coupled to the programmable reference voltage generator, the low voltage signal generator for generating a low voltage signal when the power supply voltage decreases below the programmable reference voltage; and
   a reset selector coupled to the low voltage signal generator for selectively passing the low voltage signal as a reset signal in response to a reset selector control signal.

2. The apparatus of claim 1, wherein the reset selector is configurable to operate in a first state and a second state.

3. The apparatus of claim 2, wherein the reset selector is configured to operate in the first state during a power up operation.

4. The apparatus of claim 2, wherein the reset selector does not pass the low voltage signal as the reset signal in the first state.

5. The apparatus of claim 2, wherein the reset selector is configured to operate in the second state after the power up operation.

6. The apparatus of claim 2, wherein the reset selector passes the low voltage signal as the reset signal in the second state.

7. The apparatus of claim 1, wherein the reset selector comprises a latch element coupled to a multiplexer.

8. The apparatus of claim 1, wherein the programmable reference voltage generator comprises a resistor ladder.

9. The apparatus of claim 1, wherein the reset selector is configured to not pass the low voltage signal as the reset signal during a power up operation if the power supply voltage is at a first voltage and is configured to pass the low voltage signal as the reset signal after the power up operation if the power supply voltage is at a second voltage higher than the first voltage.

10. The apparatus of claim 1, further comprising:
    a first configuration register coupled to the reset selector, the first configuration register configured to generate the reset selector control signal;
    a second configuration register coupled to the programmable reference voltage generator;
    wherein the reset selector is configured to selectively pass the low voltage signal as the reset signal in response to the first configuration register, and the programmable reference voltage generator is configured to generate the programmable reference voltage in response to the second configuration register.

11. The apparatus of claim 10, further comprising:
    a second low voltage signal generator for generating a second low voltage signal when a second power supply voltage decreases below a second reference voltage; and
    an OR gate coupled to the first low voltage signal generator and the second low voltage signal generator, and configured to generate the reset signal.

12. A method of generating a low voltage reset signal, comprising:
    generating a plurality of low voltage signals, each low voltage signal indicating when an associated power supply voltage is less than an associated reference voltage;
    selecting a set of low voltage signals from the plurality of low voltage signals, the set of low voltage signals including at least one low voltage signal of the plurality of low voltage signals; and
    combining the set of low voltage signals into the low voltage reset signal.

13. The method of claim 12, wherein selecting the set of low voltage signals further comprises:
    selecting only a subset of the set of low voltage signals during a power-up operation, the subset having at least one less than all of the low voltage signals in the set.

14. The method of claim 12, wherein selecting the set of low voltage signals further comprises:
excluding at least one low voltage signal from the set during a power-up operation; and
including the at least one low voltage signal in the set after the power-up operation.

15. The method of claim 12, wherein for at least one low voltage signal, generating the low voltage signal further comprises:
generating a programmable reference voltage; and
comparing the programmable reference voltage to the associated power supply voltage.

16. The method of claim 15, wherein generating the programmable reference voltage comprises:
generating the programmable reference voltage at a voltage such that the associated low voltage signal does not indicate a reset state during a power-up operation.

17. A low voltage reset apparatus, comprising:
a plurality of low voltage signal generators, each low voltage signal generator configured to generate a low voltage signal indicating when an associated power supply voltage is less than an associated reference voltage; and
a logic circuit coupled to each low voltage signal generator and configured to generate a reset signal in response to the low voltage signals, the logic circuit including:
a multiplexer coupled to at least one of the low voltage signal generators; and
a combinatorial logic circuit coupled to the multiplexer and at least one other low voltage signal generator, the combinational logic circuit configured to generate the reset signal.

18. The low voltage reset apparatus of claim 17, wherein at least one low voltage signal generator comprises:
a programmable reference voltage generator configured to generate a programmable reference voltage; and
a comparator coupled to the programmable reference voltage generator and a power supply associated with the low voltage signal generator, the comparator configured to generate the low voltage signal.

19. The low voltage reset apparatus of claim 17, wherein:
the low voltage signal generators include a first low voltage signal generator and a second low voltage signal generator; and
the multiplexer includes a first input coupled the first low voltage signal generator, a second input coupled to a ground, a control input, and an output; and
further comprising:
a register including an output coupled to the control input of the multiplexer;
an OR gate including a first input coupled to the output of the multiplexer and a second input coupled to the second low voltage signal generator.

* * * * *